Jan. 30, 1973 D. NIXEN ET AL 3,714,370

PLASTIC PACKAGE ASSEMBLY FOR ELECTRONIC CIRCUIT
AND PROCESS FOR PRODUCING THE PACKAGE

Original Filed Aug. 10, 1970 5 Sheets-Sheet 1

INVENTORS
DAVID NIXEN
CHUNE LEE

BY Robert G. Rogers
ATTORNEY

INVENTORS
DAVID NIXEN
CHUNE LEE
BY Robert G. Rogers
ATTORNEY

Jan. 30, 1973 D. NIXEN ET AL 3,714,370

PLASTIC PACKAGE ASSEMBLY FOR ELECTRONIC CIRCUIT AND PROCESS FOR PRODUCING THE PACKAGE

Original Filed Aug. 10, 1970 5 Sheets-Sheet 3

INVENTORS
DAVID NIXEN
CHUNE LEE
BY
Robert G. Rogers
ATTORNEY

INVENTORS
DAVID NIXEN
CHUNE LEE
BY
Robert G. Rogers
ATTORNEY

INVENTORS
DAVID NIXEN
CHUNE LEE
BY Robert G. Rogers
ATTORNEY

United States Patent Office
3,714,370
Patented Jan. 30, 1973

3,714,370

PLASTIC PACKAGE ASSEMBLY FOR ELECTRONIC CIRCUIT AND PROCESS FOR PRODUCING THE PACKAGE

David Nixen, Anaheim, and Chune Lee, Costa Mesa, Calif., assignors to North American Rockwell Corporation Continuation of application Ser. No. 62,375, Aug. 10, 1970. This application Jan. 24, 1972, Ser. No. 220,024
Int. Cl. H05k 5/00
U.S. Cl. 174—52 S 4 Claims

ABSTRACT OF THE DISCLOSURE

This invention is directed to a process for making a package and for the package which has a semiconductive device therein and comprises a plurality of conductor leads terminating in a central opening in the package. A header in the package comprises sidewalls of synthetic resin material in direct contact with the leads. The header includes the central opening and the leads have portions thereof extending outward from the header. A metallic cover having a gold facing is used for bonding the semiconductive material of the device directly to the gold facing. The periphery of the metallic cover is attached to the synthetic resin material at one end of the central opening and forms a chamber within which the semiconductive device is housed. The metallic cover also provides structural support for the semiconductive device and is an integral part of the package. The leads which are attached to the semiconductive device extend outward from the package for providing input and output connective paths to and from the semiconductive device. Another cover is used at the opposite end, opposite to the first cover, of the package to seal the chamber and the device.

This is a continuation of pending application Ser. No. 62,375, filed Aug. 10, 1970, now abandoned.

BACKGROUND OF THE INVENTION

(1) Field of the invention

The invention relates to a "flat-pack" for an electronic circuit and a process for producing the "flat-pack" and more particularly to such a package comprising a monolithic plastic housing formed directly onto the leads of the package.

(2) Description of prior art

The prior art is believed represented by Pat. No. 3,484,-533 for "A Method for Fabricating Semiconductor Package and Resulting Article of Manufacture" by John E. Kauffman, issued Dec. 16, 1969, U.S. Pat. No. 3,550,766, issued Dec. 29, 1970 shows an electronic package utilizing a metallized electronic circuit therein.

The Kauffman patent is believed significant since it shows a nickel-iron flat lead frame 10 with continuous (unbroken) leads 20 and 22 extending inwardly from members 12 and 14 towards a centrally located open space having dimensions sufficient to accommodate chip 24. A seamless tubular header body 30 is formed independent of the lead frame. After it is formed, the leads 20 and 22 are sprung for assembling the header to the frame. An opening for accommodating chip 24 is punched through the top wall of the header before it is assembled about the frame.

The header body is then filled with a liquid slurry comprising glass particles. The assembly is placed in an oven to evaporate the water in the slurry. The resulting assembly comprises a header of an insulating material filled with a solid glass material (see FIG. 1).

The exposed surface areas of the Kauffman frame are then gold plated and device 24 is inserted in the opening of the lead frame. Top and bottom covers are applied to hermetically seal the device inside the opening.

The referenced patent application by Nixen et al., shows a housing (header) comprised of a bottom ceramic wafer 20 on which a conductor pattern has been formed and a top ceramic wafer 26 which is laminated to the wafer 20 for providing structural stability and mechanical strength to the leads of the flat lead pack.

The inwardly projecting leads 12 are brazed (connected) to termination pads at the edges of the ceramic wafer 20. Ordinarily gold or an equivalent metal is plated over the leads 12 and termination pads to facilitate brazing of the leads to the pads. Gold is also plated over the lead terminations at the center of the lead frame which has an opening for accommodating microelectronic circuit 40. The microelectronic circuit 40 is electrically connected inside the opening and the opening is then hermetically sealed.

Support tabs 16 are also shown in the Nixen et al. application as being bonded to the ceramic wafer 20. The support tabs 16 are used in connection with testing and for support purposes as described in the application.

The type of "flat-pack" (package for electronic circuits) package described in the referenced patent and patent application are believed to be relatively expensive. For example, a ceramic flat-pack package of the type shown and described in the referenced patent application may cost in excess of one dollar. The relatively expensive character of the package is attributed to the ceramic materials used, the gold plating, and the process steps required to produce a final package.

Ceramic materials as well as glass filled materials, withstand relatively high temperatures and are particularly suited for operating environments that may undergo wide fluctuations in temperatures. However, in many applications the maximum operating temperatures are relatively low such that a ceramic or glass filled material is not required.

A relatively inexpensive flat-pack produced from a material and in accordance with a process that would be able to operate satisfactorily at relatively lower operating temperatures, without sacrificing mechanical strength and structural stability is preferred. The present invention described a flat-pack and process for producing the flat-pack.

BRIEF SUMMARY OF THE INVENTION

Briefly, the invention comprises a relatively inexpensive and easily produced package comprising a monolithic plastic housing formed directly onto the electrically conductive leads of the package. The package comprises a flat lead frame including electrically conductive leads projecting inwardly from opposite sides of a lead frame. The lead terminations encircle a centrally located opening sufficient to accommodate a semiconductor chip incorporating an electronic circuit such as a large scale integrated circuit.

In the preferred embodiment, the plastic housing is molded in direct contact with both sides of the inwardly projecting leads, leaving an opening for the semiconductor chip encircled by a chamber. The plastic material flows in the spaces between the leads to form a unitary or monolithic structure. The terminations of the inwardly projecting leads are exposed in the central opening. The lead frame and inwardly projecting conductors may be stamped or etched from a conducting metal sheet comprised, for example, of a nickel-iron alloy.

A semiconductor chip is affixed on the inside surface of a bottom cover which is fitted under the opening. The electronic circuit of the semiconductor chip is electrically connected to the terminations of the inwardly projecting leads and a top cover seals the circuit inside the chamber formed by the plastic housing.

In the preferred embodiment, the lead frame is then coated with a conducting metal such as solder or tin.

Gold can be eliminated as a plating material since the inwardly projecting leads are continuous. In the case where the leads must be bonded to termination pads on the housing, gold is preferred since gold plated leads can be quickly and easily bonded to the gold plated termination pads of the housing.

In a variation of the preferred embodiment, the lead terminations around the central area are coated with a thin layer of metal such as aluminum. The metal coating facilitates the electrical connection of the pads on the semiconductor chip to the lead terminations. Both the gold and aluminum may be clad on instead of plated.

Inasmuch as the preferred process does not use ceramic wafers as the housing and does not require filling a tubular header with a glass filled material, the package is believed to be relatively less expensive than existing commercial packages used for the same purpose. Although the plastic housing may not withstand the temperatures of ceramic and glass materials, it is believed that the package with the plastic housing provides the same mechanical strength and structural stability without downgrading the electrical insulative and hermetic sealing characteristics required of a "flat-pack" such as described and shown in the previously referenced patent and patent application.

The present housing comprises a monolithic structure as compared with layers which are glued or bonded together. The latter type structure may suffer separations, trapped charges and contaminates, leakage, etc. The monolithic structure avoids those disadvantages.

Support tabs are not required for the package. However, support tabs may be connected to the housing so that the leads can be severed from the frame adjacent to the edges of the frame members are tested without the necessity for removing the flat-lead package from the frame.

After the electronic circuit connected in the housing has been tested, the lead frame protects the lead of the package during shipment. The support tabs are bonded to the housing but are otherwise electrically insulated from the inwardly projecting leads. Ordinarily, the tabs project inwardly from opposite frame members orthogonally to the inwardly projecting leads.

Therefore, it is an object of this invention to provide a package for an electronic circuit having a plastic housing in direct contact with the leads of the package.

Another object of this invention is to provide a process for producing a package for an electronic circuit in which plastic is used as the housing material.

A still further object of this invention is to provide a relatively inexpensive and easily produced package for an electronic device comprising a housing produced by molding plastic directly onto both sides of leads projecting inwardly from opposite sides of a lead frame.

A still further object of this invention is to provide a flat-lead package for electronic assemblies which does not require the use of high temperature ceramics and/or glass materials for the housing or header portion of the package.

A still further object of this invention is to provide a flat-pack for electronic assemblies which can be produced without gold plating and which uses a plastic material for the housing portion of the package.

A further object of this invention is to provide a lead package for electronic assemblies that can be produced relatively inexpensively by using a package housing material formed in direct contact on both sides of and between the leads.

These and other objects of the invention will become more apparent when taken in connection with the description of the drawings, a brief description of which follows:

DESCRIPTION OF THE PREFERRED EMBODIMENTS

Figure 1:
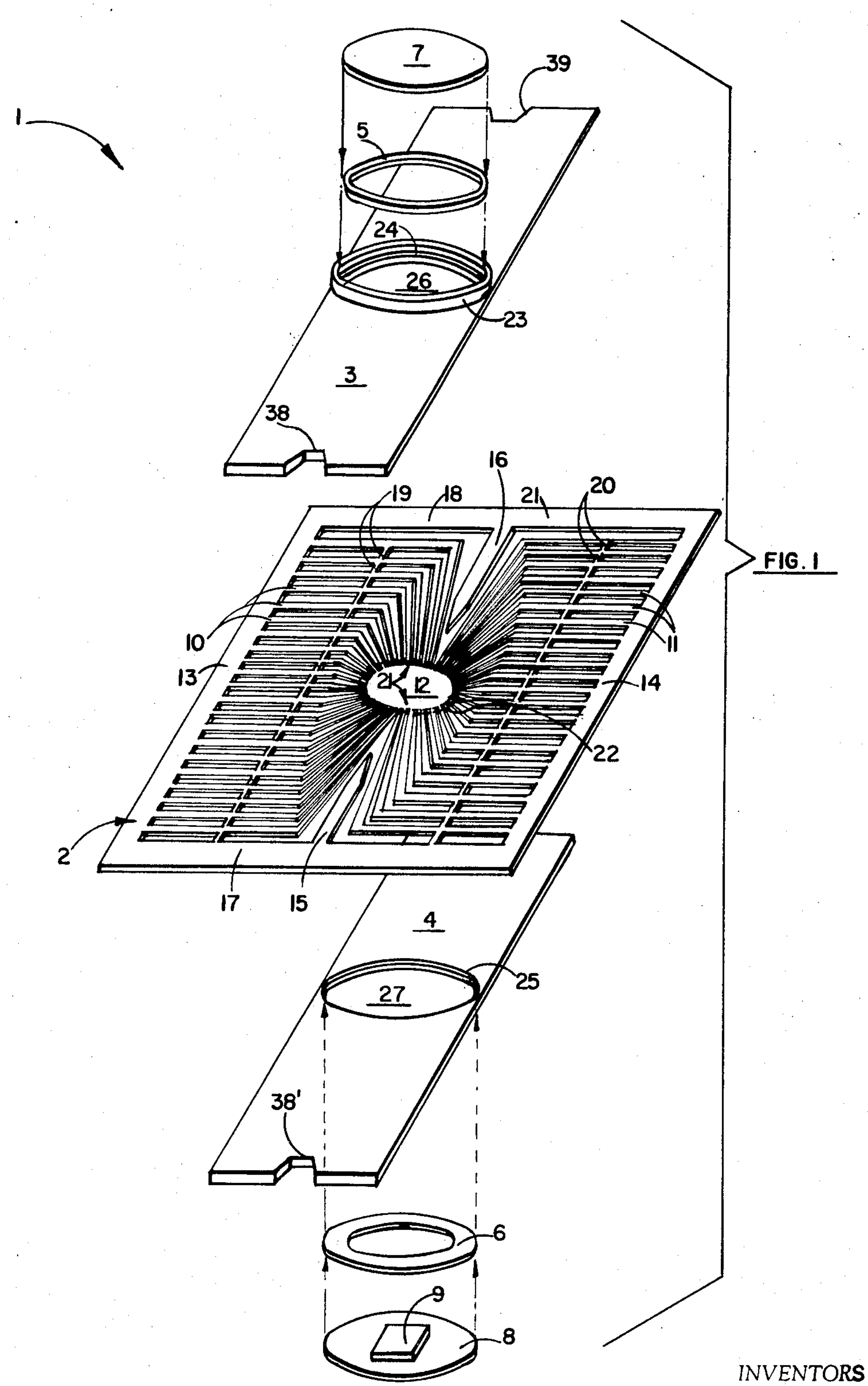
FIG. 1 is an exploded, perspective view of the parts of a preferred embodiment of a package using a plastic housing. A semiconductor chip embodying an electronic circuit is also shown.

FIG. 1 is a perspective view of one embodiment of a package 1 comprising a flat lead frame 2, upper housing layer 3, and lower housing layer 4. Adhesive rings 5 and 6 for upper and lower covers 7 and 8 are also shown. Semiconductor chip 9 on top of lower cover 8 incorporating an electronic circuit, is not part of the basic package as initially manufactured.

It is pointed out that although the housing for the package is illustrated in FIG. 1 as comprising layers, such layers are not individually formed in the preferred embodiment. A monolithic structure is preferred for reasons previously indicated. The housing is illustrated as comprising layers for convenience. As will become apparent during the description of the preferred process, the housing structure is monolithic in nature. The housing layers 3 and 4 should be considered as the upper and lower portions of the plastic housing of the package. The housing may also be referred to as a header.

The basic package can be manufactured and sold without an electronic circuit. A user can incorporate an electronic circuit, hermetically seal, test and use the package as required for a particular application. Alternately, the electronic circuit can be incorporated in the package at the time it is manufactured. The manufacturer can seal, test, and sell the package incorporating the electronic circuit to satisfy the particular requirements of a market.

Figure 6:
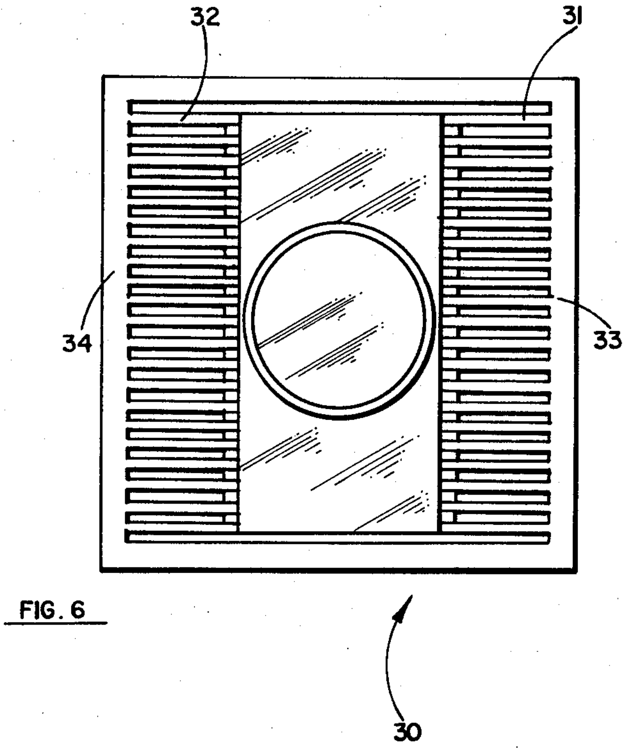
FIG. 6 is a top view of a different embodiment of the package without support tabs.

The lead frame 2 includes conductor leads 10 and 11 which project inwardly to form central opening 12. The conductor leads are integral with the frame members 13 and 14 respectively. Support tabs 15 and 16 extend inwardly from frame members 17 and 18. In other embodiments, the support tabs may be omitted as shown in FIG. 6.

The central opening, or area, 12 has a circular configuration for the embodiment shown and a diameter sufficient to accommodate an electronic-circuit having an anticipated size. The terminations 21 of the leads 10 and 11 encircle the central opening 12 and provide contacts for electrically connecting an electronic circuit to the leads as described subsequently. It is pointed out that the central opening may have a non-circular configuration such as oval, rectangular, square, and other geometrical and non-geometrical configurations. The exact size and configuration of the central opening 12 depends on the requirements of a particular application.

Damming strips 19 and 20 for leads 10 and 11 provide structural support to the leads. The strips reduce bending and structural deviations which could otherwise impair the usefulness of the lead frame during processing. The damming strips also restrict the excessive flow of plastic during the molding process. The damming strips are cut away during the assembly process, as described subsequently.

The lead frame may be etched or stamped in the configuration shown from a sheet of conducting metal. The lead frame may also be formed by other processes known to persons skilled in the art. In one embodiment, the metal sheet may have a thickness of 0.010 inch and may be comprised of a nickel-iron alloy, copper, etc.

In the preferred embodiment, the tips or terminations 21 of the leads encircling the central opening 12 are coated with a conducting metal layer such as aluminum or gold to facilitate electrically connecting the input/output pads of the electronic circuit to the leads. The aluminum coating may be deposited by using a suitable mask before forming the lead frame or after the lead frame has been formed. The exact sequence of steps to be followed in depositing or otherwise forming the aluminum, gold, etc. coating is not believed significant. Aluminum is the preferred metal since it is relatively less expensive than gold. The metal coating is designated by the numeral 22.

In ordinary batch fabrication or production line techniques, a plurality of lead frames are formed sequentially or simultaneously from a strip of metal having the desired thickness. Ordinarily the lead frames are interconnected by relatively thin metal connectors extending between the frame members of the lead frames. The thin metal connectors are easily cut or broken to separate lead frames during assembly.

The upper and lower housing layers 3 and 4 are comprised of a plastic material such as a dry granulated epoxy resin capable of being transfer molded by heat and pressure. Such epoxy resins are commercially available. Other plastics such as diethyl phthalate, silicone, phenolic can also be used. The upper and lower layers 3 and 4 of the housing therefore have sidewalls of any of the epoxy resin above stated. Such epoxy resins are synthetically prepared.

The upper housing layer 3 has a raised rim 23 including a recessed ledge 24 along its inside diameter. The rim 23 has a height sufficient to permit an electronic circuit to be placed inside the cavity, or chamber, formed by the rim and electrically connected to the terminations of the leads 10 and 11 of lead frame 2. The ledge 24 provides support for adhesive ring 5 when cover 7 is placed over the cavity during the hermetic sealing process.

The lower housing layer 4 includes a recessed ledge, or ring, 25 roughly corresponding to the displacement of the rim 23 of layer 3 from the central area 12. The recessed ledge 25 accommodates adhesive ring 6 which is used when attaching cover 8 to the bottom of the housing layer 4 and providing a base for the electronic circuit. The circuit is secured to the bottom of cover 8, as described subsequently.

The housing layers are notched at areas 38, 38' and 39, 39' (not shown in FIG. 1), to permit the support tabs 15 and 16 to be cut back within the plastic housing. The remaining portions of the tabs are recessed within the notches so that adjacent packages mounted on a circuit board do not make electrical contact.

Although the plastic housing, illustrated by layers 3 and 4, can be made by other suitable processes, the preferred process forms the monolithic plastic housing in direct contact with the conducing metal leads by a transfer molding technique. Injection molding and other processes may also be used. A two piece mold incorporating multiple cavities is used for producing the housing layers in the configuration shown. The construction of molds which can be used in the preferred process are believed to be within the abilities of a person skilled in the art. For that reason, additional details on the mold are not included herein.

In molding the plastic housing, the mold is mounted in a transfer molding press. The lead frame is positioned between the two mold pieces. The mold is then clamped by the transfer molding press in contact with the lead frame with sufficient pressure to minimize or eliminate plastic leakage.

The epoxy molding powder is compacted, for example, into cylinders of one inch diameter with a height of one inch, in a compacting press giving a charge of approximately 10 grams. Sufficient cylinders or pellets of the molded epoxy powder equal to 6 grams per cavity of the mold are preheated in a dielectric preheater to a marshmallow consistency. In a typical process, approximately 15 seconds with 250 milliamperes of current is required to preheat the molded epoxy powder pellets.

After the pellets have been heated, the charge is dropped into the transfer cylinder of the transfer molding press. The term charge is used to describe the preheated quantity of the molded epoxy. A transfer plunger is moved into the transfer cylinder and a pressure of typically 500–1,000 p.s.i. is applied to the charge. The mold is heated to a temperature of typically 325° F.

The temperature of the mold reduces the viscosity of the plastic material (epoxy) causing it to flow into the cavities of the mold under the applied pressure. The continued application of the heat to the mold eventually solidifies the thermo-setting plastic and the plastic housing is formed in contact with the conducting metal leads of the lead frame and in contact with each other. In other words, the plastic housing, illustrated by layers 3 and 4, laminated together as a single layer or unitary structure with the conductor leads 10 and 11 enclosed or covered by the plastic housing. The plastic actually flows between the leads 10 and 11 and blends together during the molding step.

After the plastic material comprising the housing has solidified, the mold is separated and the package 1 including the molded plastic housing is removed. Excessive plastic and cull materials are removed. In addition, individual package are separated by cutting the thin connecting members. The damming strips 19 and 20 and the flash material are also removed. The damming strips and flash material may be removed by cutting or by other processes known to persons skilled in the art. Such process steps may be accomplished automatically depending upon the type of manufacturing equipment being used.

The upper and lower covers 7 and 8 illustrated as discs are typically comprised of a nickel-iron alloy, or copper coated by gold or an equivalent metal. The disc may be formed by stamping or other known techniques. In one process embodiment, the inner surface of the bottom cover is gold plated. As indicated above, the covers 7 and 8 are secured to the upper and lower housing layers by means of adhesive rings 5 and 6. The adhesive rings is one embodiment are epoxy preform rings which may be stamped from a sheet of epoxy prepreg. For example, an epoxy sheet having a thickness of 0.004 inch may be used to stamp out rings having a 0.500 inch outer diameter and a 0.375 inch inner diameter. The preformed rings are placed on the ledge 24 and 25 of the housing layers 3 and 4.

In one manufacturing process, a semiconductor chip 9 such as a silicon chip is attached to the gold plated side of the lower cover 8. The semi-conductor chip 9 is previously processed according to known techniques to incorporate a microelectronic circuit therein.

The chip 9 may be attached to the gold plated side of cover 8 by heating the cover to approximately 400–500° C. on a heated surface. The chip 9 is held with a gripping tool and is mechanically scrubbed on the gold surface to form an intimate gold-silicon eutectic metallic bond upon solidification of the melted eutectic metal.

The chamber is formed by the openings 26 and 27 in the housing, illustrated by layers 3 and 4, and opening 12 in lead frame 2.

After the ring 6 has been placed on the recessed ledge 25, the bottom cover 8 to which chip 9 has been attached is positioned on top of the ring so that the chip 9 is on the inside of the package. The bottom cover fits flush on the recessed ledge 25 within the housing layer 4. The bottom cover is held in place on the bottom of the lower housing layer 4 by, for example, a spring clip. Other means may also be used. The assembly is then placed in an oven maintained at a temperature between 125°–350° C. for approximately five minutes for melting the epoxy preform ring 6. When the ring melts, the lower cover 8 is secured to the lower housing layer 4. The metal cover 8 is sealed to the plastic housing layer 4.

As indicated above, however, it is not necessary that the chip 9 be secured within the package. The package can be manufactured and sold separately. The user can then incorporate an electronic circuit in the package as required. In addition, the temperature examples, dimensions, and other specific illustrations are given for purposes of describing one embodiment of a manufacturing process using a silicon chip. The process parameters including temperature, pressures, thicknesses, etc. may be changed if different materials, etc. are used.

After the bottom cover has been secured to the bottom housing layer 4, the assembly is withdrawn from the oven and the spring clip holding the lower cover 8 to the housing is removed after the assembly has been cooled approximately to room temperature. Electrically conductive wires such as one mil wire, interconnect the input/output pads of the chip 9 (microelectronic circuit) with the terminations 21 of the leads 10 and 11 encircling the central opening 12. Conventional thermo-compression or ultrasonic wire bonding techniques may be used to interconnect the microelectronic circuit to the lead terminations 21. Other interconnection processes may also be used. It is also pointed out that where beam lead techniques are used, the beam leads are connected directly to the terminations 21 of the leads 10 and 11.

After the microelectronic circuit has been secured within the housing and electrically connected to the leads as indicated above, the adhesive ring 5 is placed on recessed ledge 24 and upper cover 7 is placed on top of the ring 6. Upper cover 7 fits flush on recessed ledge 24 within the upper housing layer 3. The cover is secured on the housing by a spring as indicated in connection with cover 8 and the assembly is again placed in an oven and heated for sealing the cavity inside the housing comprising layers 3 and 4. Substantially the same process as described in connection with cover 8 is followed for completing the seal.

After the microelectronic circuit has been sealed inside the housing of package 1, the assembly is removed and cooled. The spring clip is removed and the sealed package 1 is leak checked. If a leak is detected, the package is reprocessed and the leakage areas are sealed by an epoxy coating.

After the package 1 has successfully passed the leakage test, the package leads are plated with a conducting metal such as tin or solder. Gold may also be used although it is not necessary. In addition, the coating may be applied by plating, dipping, and other techniques well known to persons skilled in the art. The metal coating facilitates connecting of the leads of the package, when severed, to printed circuit boards and to other electronic circuits.

After the leads have been coated, they are severed from the lead frame and electrically tested. The packages which pass the electrical test are marked for identification and are ready for use.

The particular package shown in FIG. 1 has forty-two leads and typically is approximately 1½ inches square measured along the outer diameters of the frame. The leads typically have a width of typically 20 mils and a spacing of approximately 30 mils. A lead may have a thickness of 10 thousandths of an inch. The particular size of the package, leads, etc., as well as the number of leads may vary depending upon the particular application.

Figure 2:
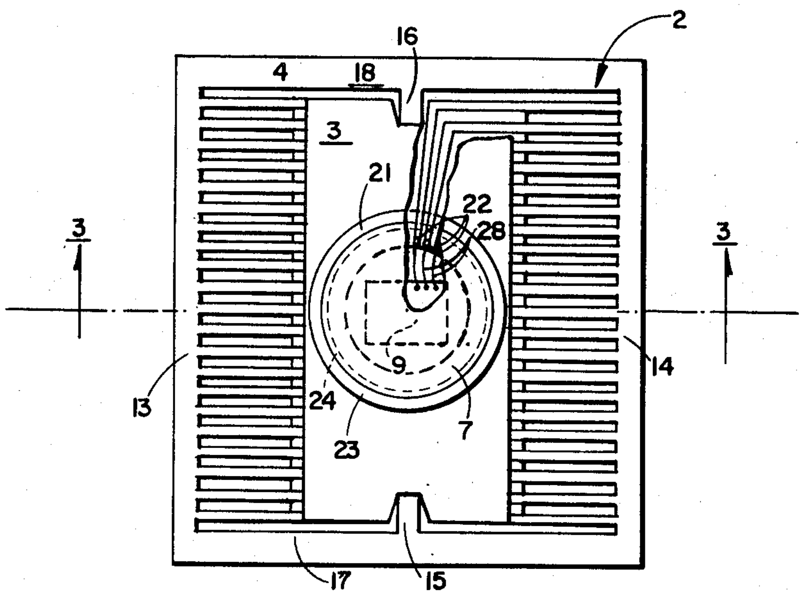
FIG. 2 is a partial cut-away, assembled view of the FIG. 1 package.

FIG. 2 is a partially cut-away top view of the FIG. 1 embodiment showing the electronic circuit 9 connected in the chamber provided by housing layers 3 and 4 around the center area 12 of the lead frame 2. Specific details of the semiconductor chip incorporating the electronic circuit are not shown since such details are well known to persons well skilled in the art. Similarly, only a minimum number of wires 28 are shown interconnecting the circuit 9 to the lead terminations 21 of leads 10 and 11. The cover 7 for the package 1 has been cut away to show the location of the circuit in the chamber.

Figure 3:
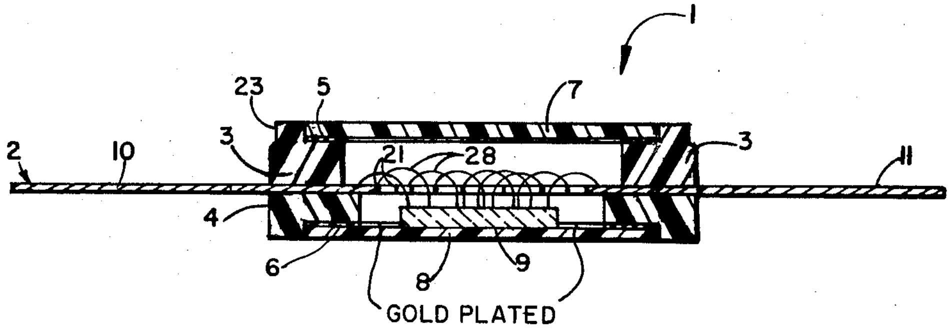
FIG. 3 is a cross-sectional view of the FIG. 2 assembled package showing the electronic circuit electrically connected to the terminations of the leads inside the central opening of the package.

FIG. 3 is a cross-sectional view of the FIG. 2 embodiment showing package 1 including leads 10 and 11 secured to the lead frame 2. Cover 7 is shown secured to the rim 23 of upper housing layer 3 by the adhesive ring 5. Similarly, cover 8 on which a chip incorporating circuit 9 has been attached is shown secured to the bottom of housing 4 by ring 6. The circuit is shown electrically connected to the lead terminations 21 by wires 28. The laminated structure of the housing comprising upper and lower housing layers 3 and 4 is also clearly illustrated.

Figure 4:
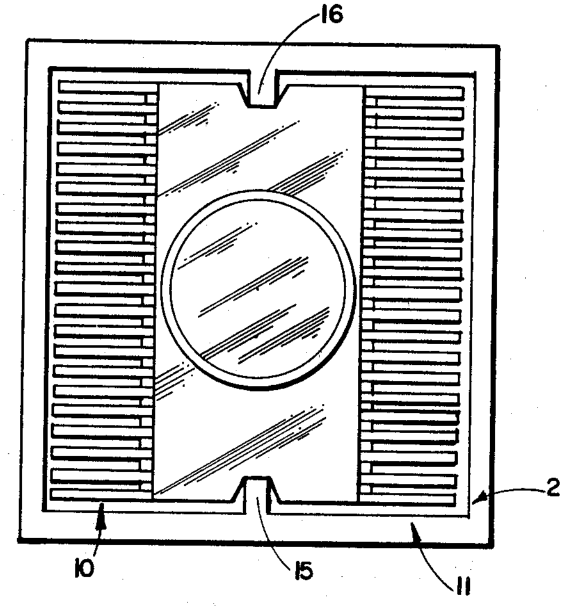
FIG. 4 is a top view of the FIG. 2 package showing the leads severed from the frame for electrical testing.

FIG. 4 is a top view of the FIG. 1 package showing leads 10 and 11 severed from lead frame 2 for testing purposes. During the electrical test, the support tabs 15 and 16 support the assembly inside the frame 2. After the test has been concluded, the frame 2 can be used to protect the assembly including the leads 10 and 11 during shipment. As a result, expensive shipping containers can be avoided.

Figure 5:
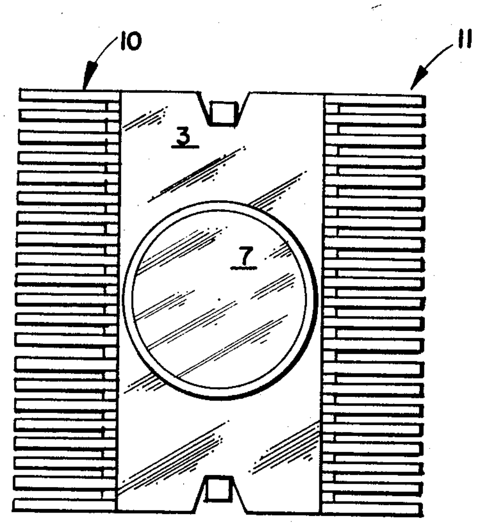
FIG. 5 is a top view of the FIG. 4 package completely separated from the lead frame.

FIG. 5 is a top view of an assembled FIG. 1 package with the lead frame and support tabs removed. After electrical test and shipment, the assembly is ready to be connected to a circuit board. At that time, the support tabs are cut to produce the FIG. 5 assembly. The remaining portions 36 and 37 of the support tabs are recessed within notches 38 and 39 to prevent electrical contact between adjacent packages as described earlier. In certain instances, alternate leads can be cut shorter than the other leads. In addition, certain leads can be bent at an angle to facilitate connecting the assembly to a circuit board or other fixture.

FIG. 6 is a top view of a different embodiment of the FIG. 1 package. The package 30 includes leads 31 and 32 extending inwardly from frame members 33 and 34 but does not include support tabs. In certain embodiments, the support tabs are not required. The package 30 can be produced by the same process as described for the FIG. 1 package. Structurally, the only substantial difference between the package is the absence of the support tabs.

Figure 7:
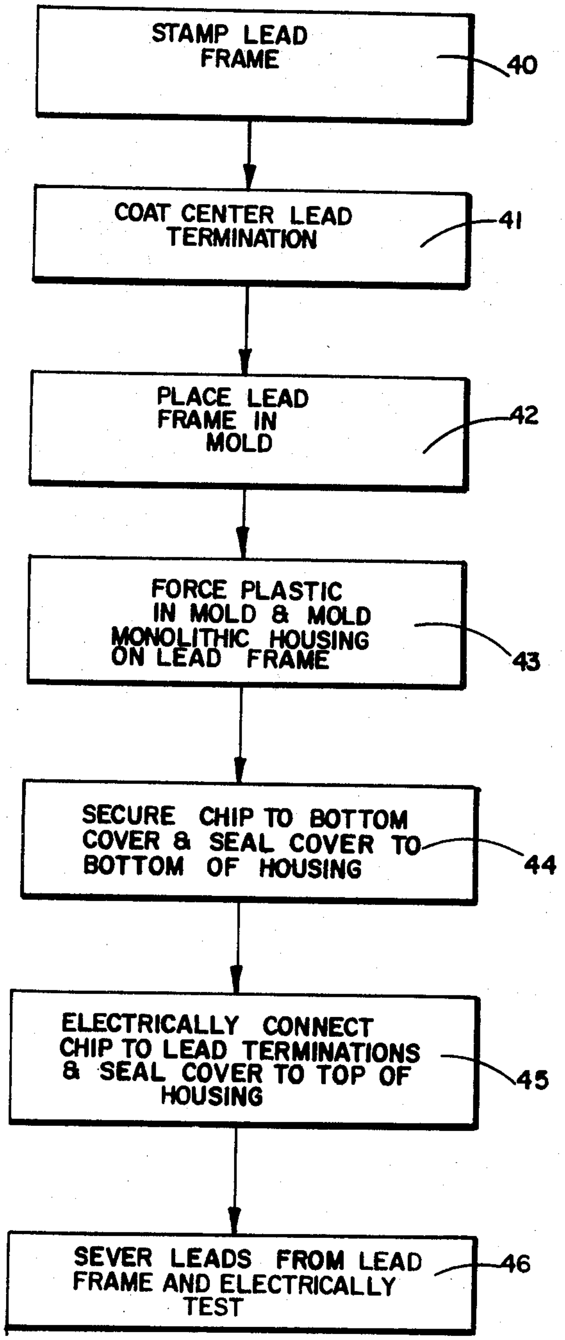
FIG. 7 is a block diagram of the steps of one embodiment of a process for forming the FIGS. 1–7 packages.

FIG. 7 is a block diagram of a summary of the steps of one embodiment of a process required to produce the FIG. 1–6 packages. In block 40 the lead frame is stamped. In block 41, the center lead terminations are coated with a conducting metal although the central area could be coated before the lead frame is stamped.

The lead frame is placed in a mold in block 42 and the plastic housing layers are formed in block 43. In blocks 44–46, the chip is secured to the bottom cover; electrically connected inside the housing chamber; the package hermetically sealed; the leads severed and the electronic circuit electrically tested.

As indicated herein, one process with variations is described as an example of one or more embodiments. Other process and structural variations are also within the scope of the invention.

We claim:

1. A package having a semiconductive device therein, comprising:

a plurality of parallel conductor leads terminating in a central opening in the package;

a header comprising sidewalls of synthetic resin material in direct contact with said leads, said header including said central opening, said leads having portions thereof extending outwardly from the header; and a metallic cover having a gold facing, the semiconductive material of said device being bonded directly to the gold facing side of the metallic cover, the periphery of the metallic cover being attached to the synthetic resin material at one end of the central opening and forming a chamber within which the semiconductive device is housed, said metallic cover also providing structural support for the semiconductive device and being an integral part of said package.

2. The invention as stated in claim 1, including:

leads attached to the semiconductive device extending outwardly from the package for providing input and output connective paths of said semiconductive device; and means for sealing said chamber.

3. A process for making a package containing a device of semiconductive material and including a lead frame having leads as integral portions thereof, comprising the steps of:

molding a housing having synthetic resin sidewalls to two oppositely disposed surfaces of the lead frame which has a central opening for providing leads that project inwardly toward the center of the lead frame;

eutectically bonding a surface of the semiconductive material of said device to a gold-faced surface of a metallic cover;

attaching the metallic cover bearing the eutectically bonded device to one end of the package opposite the central opening thereby forming a chamber within the package for retaining the semiconductive device therein; and connecting the lead terminations in the central opening to the semiconductive device.

4. The invention as stated in claim 1, including the further step of:

sealing the other end of the package opposite the metallic cover thereby encasing said device.

References Cited

UNITED STATES PATENTS

| | | | |
|---|---|---|---|
| 3,340,348 | 9/1967 | Clark et al. | 174—DIG. 3 UR |
| 3,548,076 | 12/1970 | Cooke et al. | 174—DIG. 3 UR |
| 3,627,901 | 12/1971 | Happ | 174—DIG. 3 X |

BERNARD A. GILHEANY, Primary Examiner

U.S. Cl. X.R.

174—DIG. 3; 317—234 G